(12) United States Patent
Yamashita

(10) Patent No.: US 6,732,351 B2
(45) Date of Patent: May 4, 2004

(54) METHOD OF FORMING MASK FOR CHARGED PARTICLE BEAM EXPOSURE AND PROCESSING PROGRAM OF PATTERN DATA FOR FORMING MASK FOR CHARGED PARTICLE BEAM EXPOSURE

(75) Inventor: Hiroshi Yamashita, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 99 days.

(21) Appl. No.: 10/084,501

(22) Filed: Feb. 28, 2002

(65) Prior Publication Data

US 2002/0124235 A1 Sep. 5, 2002

(30) Foreign Application Priority Data

Mar. 5, 2001 (JP) .......................................... 2001-060131

(51) Int. Cl.[7] .............................................. G06F 17/50
(52) U.S. Cl. .............................. 716/19; 378/34; 716/20; 716/21
(58) Field of Search .......................... 250/398; 716/19, 716/20, 21; 378/34

(56) References Cited

U.S. PATENT DOCUMENTS

| | | | | |
|---|---|---|---|---|
| 4,513,203 A | * | 4/1985 | Bohlen et al. | 378/34 |
| 5,166,888 A | | 11/1992 | Engelke | |
| 6,472,673 B1 | * | 10/2002 | Chalupka et al. | 250/398 |

FOREIGN PATENT DOCUMENTS

| | | |
|---|---|---|
| JP | 05-205053 | 8/1993 |
| JP | 06-132206 | 5/1994 |
| JP | 11-040475 | 2/1999 |
| JP | 11-135417 | 5/1999 |
| JP | 11-204422 | 7/1999 |
| JP | 11-243045 | 9/1999 |
| JP | 11-258771 | 9/1999 |
| JP | 11-307429 | 11/1999 |

OTHER PUBLICATIONS

H. Yamashita et al., "Development of Mask–Split Algorithm Using Computational Geometry", Extended Abstracts, No. 2, 7a–X–8, p. 620 (2000).
U. Behringer et al., "Intelligent Design Splitting in the Stencil Mask Technology Used for Electron– and Ion–beam Lithography", J. Vac. Sci. Technol. B 11(b), pp. 2400–2403 (1993).
H. Bohlen, et al., "Electron–Beam Proximity Printing—A New High–Speed Lithography Method for Submicron Structures", IBM J. Res. Development, vol. 26, No. 5, pp. 568–579 (9/82).

* cited by examiner

Primary Examiner—Vuthe Siek
Assistant Examiner—Thuan Do
(74) Attorney, Agent, or Firm—Whitham, Curtis & Christofferson, PC

(57) ABSTRACT

The present invention relates to a method of forming a mask with an opening pattern used for a charged particle beam exposure; which comprises the steps of: outlining a pattern figure represented by prescribed pattern data; descerning whether every polygonal pattern represented by pattern data being obtained through said contouring is a convex polygon or not; splitting every polygonal pattern which is not identified as a convex polygon into a plurality of pattern sections; and distributing a plurality of said pattern sections onto masks which constitute a set of complementary masks. In the present invention, any of singular patterns which may cause a problem in stencil mask formation is, through systematical identification, extracted and then, this singular pattern is split and distributed onto different masks constituting a set of complementary masks so that, while maintaining sufficient mechanical strength, the number of openings can be reduced to a minimum by avoiding superfluous pattern splitting. As a result, a stencil mask capable to improve the reliability of the pattern projection can be provided efficiently.

19 Claims, 10 Drawing Sheets

(a)

(b)

(c)

(d)

(a)

(b)

(c)

(a)

(b)

(a-1)

(b-1)

(a-2)

(b-2)

(a)

(b)

(a1)

1 Pattern area for reversing
2 Complementary pattern
(a2)

(b1)

(b2)

(c1)

(c2)

(d1)

(d2)

(a)

(b)

(a)

(b)

(c)

(d)

(e)

(a)

(b)

(c)

(d)

(a)  (b)

(a1)  (a2)  (a3)

(b1)  (b2)  (b3)

(a)

(b)

(c)

METHOD OF FORMING MASK FOR CHARGED PARTICLE BEAM EXPOSURE AND PROCESSING PROGRAM OF PATTERN DATA FOR FORMING MASK FOR CHARGED PARTICLE BEAM EXPOSURE

TECHNICAL FIELD

The present invention relates to a method of forming a mask used for the charged particle beam exposure and a program for processing pattern data for forming a mask for the charged particle beam exposure, and more particularly to a method of forming a mask used for the EPL (Electron-beam Projection Lithography) and a program for processing pattern data therefor.

BACKGROUND OF THE INVENTION

In recent years, accompanying progress in the degree of integration of semiconductor devices, miniaturization of the patterns to be projected into semiconductor wafers have been further advancing, and for the projection of such minute patterns, exposure methods with charged particle beams such as electron beams or ion beams have been employed.

In the exposure methods, using charged particle beams, for example, electron beams, stencil masks are generally utilized as masks for the pattern projection. The stencil mask has a structure in which openings in the form of a prescribed pattern is set in a thin substrate made of silicon or similar material. With such a stencil mask being used, in the electron beam exposure method, an electron beam consisting of electrons which pass through the openings in the form of a prescribed pattern travels through a projection optical system and forms an image on a wafer, and thereby projection of the pattern is made. An electron beam consisting of electrons which, in irradiation, fall on a region of the stencil mask other than the openings is thereby blocked from reaching the wafer by the mask substrate through absorption, reflection or heavy scattering. Having traversed the mask substrate, some rays of the electron beam are heavily scattered and are cut off by a limiting aperture in the projection optical system, and they do not arrive on the wafer.

Meanwhile, in the electron beam exposure method, there is also utilized a membrane-type mask (referred to as a "continuous membrane mask" hereinafter) in which an electron-beam scatterer in a prescribed shape is set on an electron-beam transmittable thin film with a small electron-beam scattering power. In the electron beam exposure method utilizing such a continuous membrane mask, electrons which traverse the thin film region of the mask where no electron-beam scatterer is formed form an image on a wafer, and thereby projection of the pattern is made. The electrons, having traversed the electron-beam scatterer of the mask, are heavily scattered and cut off by a limiting aperture so that they cannot arrive on the wafer.

As against the continuous membrane mask of this sort, the afore-mentioned stencil mask is widely used. The reason lies in a fact that, with the stencil mask, electrons to form an image on the wafer pass through the opening thereof so that, compared with the continuous membrane mask with which image-forming electrons have to traverse a thin film thereof, no energy loss by the mask occurs or the resolution is not lowered by chromatic aberration, and, thus, a high resolution can be obtained. Moreover, fabrication of stencil masks is also relatively easy.

For the stencil mask of this sort, however, the pattern must be formed by the layout of openings. This gives rise to a problem that the pattern shape possible to be formed becomes limited.

For example, because a structure with a pattern (referred to as a "doughnut pattern" hereinafter) in which a screening region to block the electron beam is completely surrounded by an opening, as shown in FIG. 1(a), cannot itself support its screening region that is like an isle surrounded by an opening, and this region will fall out, it is impossible to form a stencil mask with this pattern. Furthermore, in a structure with a pattern (referred to as a "leaf pattern" hereinafter) wherein an opening is not set around the entire perimeter of the inner screening region but formed in such a way that the inner screening region is linked with the peripheral screening region by a part of its perimeter, as shown in FIG. 1(b) (leaf type) and FIG. 1(c) (tongue type), the linking section has a substantially low mechanical strength so that the inner screening region is bound to fall off, while the mask is in use or even in fabrication. In addition, for a structure with a pattern (referred to as an "L-shaped pattern" hereinafter) in which an opening is in the shape of the letter "L" or the shape that the letters "Ls" are joined together, the stress is liable to center at both ends of corner sections of the screening region which extends into the opening, and thus the mask may be easily damaged at those sections.

Accordingly, to overcome these problems, there has been employed a method in which a prescribed pattern is divided into a plurality of sections and, by distributing these sections onto two masks, complementary opening patterns are formed in respective masks, and, using these two complementary masks, pattern transcription is carried out twice and, at the end, a prescribed pattern is transcribed onto a wafer (J. Vac. Sci. Technol. B (1993) Vol. 11(6), pp. 2400–2403).

For instance, in Japanese Patent Application Laid-open No. 132206/1994, there is disclosed a method wherein a doughnut pattern shown in FIG. 2(a) is divided into two, and, using alternately a first mask with an opening pattern shown in FIG. 2(b) and a second mask with an opening pattern shown in FIG. 2(c), and a doughnut pattern is transcribed.

Further, in U.S. Pat. No. 5,166,888, a method of splitting a pattern in formation of complementary masks is disclosed. An example of this method is described below, with reference to FIG. 3. In FIG. 3(a), a prescribed pattern (H) that is to be transcribed onto a wafer is shown, and a set of cutting lines for the pattern is each shown in FIGS. 3(a-1) and (a-2). The cutting lines shown in FIG. 3(a-2) are the ones selected to use. FIG. 3(b) shows a stencil mask having an opening in the form of a pattern corresponding to FIG. 3(a). Further, FIGS. 3(b-1) and (b-2) show a set of two complementary masks, which are used alternately to transcribe, at the end, the pattern of FIG. 3(a).

Firstly, all corners of a polygon (100), an outline of which is in the form of the prescribed pattern (H), are determined. Next, all inside corners 102, 103, 104 and 105 are determined. Herein, all corners other than inside corners are called outside corners.

Next, as shown in FIG. 3(a-1), cutting lines 107, 108, 109 and 110 are laid down from each inside corner to its opposing sides. Although cutting lines are, here, laid down from all inside corners, only an inside corner whose specifically assigned stability value does not satisfy a specific criterion can be selected for the inside corners from which cutting lines are actually laid down. Next, among these sets of possible cutting lines, a set of cutting lines which have the shortest lengths and do not intersect one another are chosen (112, 113, 114 and 115 of FIG. 3(*a*-2)). The prescribed pattern (H) is, then, split by these chosen cutting lines into a plurality of sections (H'), and a plurality of these sections (H') are distributed to two masks. That is, in one mask, as shown in FIG. 3 (*b*-1), there are formed opening patterns 117, 119 and 120, each of which corresponds to a section (H') distributed to this mask, out of a plurality of sections (H'), while, in the other mask, as shown in FIG. 3(*b*-2), there are formed opening patterns 118 and 121, each of which corresponds to a section (H') distributed to this second mask, out of a plurality of sections (H').

Although the above disclosure has been made to propose a splitting technique for the projection of patterns that may bring about a problem to the stencil mask, any effective method capable to extract singular patterns such as a doughnut pattern, a leaf pattern and an L-shaped pattern systematically from a group of various patterns has not been known. For that reason, even a pattern which hardly requires splitting is processed together for pattern splitting. In consequence, not only the processing efficiency becomes low but also numerous minute pattern sections (segments) are produced and, in the pattern projection, exact connection positions for the pattern sections become difficult to find so that changes in dimensions of the pattern connection sections or even breaking thereof may occur, lowering reliability of the pattern projection.

SUMMARY OF THE INVENTION

An object of the present invention is to provide a stencil mask by an efficient method, wherein singular patterns which may cause a problem in stencil mask formation are systematically extracted and split, whereby the number of pattern openings is minimized while maintaining sufficient mechanical strength, and the reliability of the pattern projection is raised.

The present invention relates to a method of forming a mask with an opening pattern used for a charged particle beam exposure; which comprises the steps of:

contouring a pattern figure represented by prescribed pattern data;

descerning whether every polygonal pattern represented by pattern data being obtained through said contouring is a convex polygon or not;

splitting every polygonal pattern which is not identified as a convex polygon into a plurality of pattern sections; and distributing a plurality of said pattern sections onto masks which constitute a set of complementary masks.

Further, the present invention relates to a method of forming a mask used for the charged particle beam exposure as set forth above, wherein, in said step of discerning, a signed area of triangle $\Delta p_{i-1}p_ip_{i+1}$ composed of three adjacent vertices $p_{i-1}$, $p_i$ and $p_{i+1}$ is obtained one by one for a vertex $p_i$ in the polygonal pattern, and once there are identified vertices for which a sign of the area $\Delta p_{i-1}p_ip_{i+1}$ becomes opposite to the sign thereof with which an interior angle $\angle p_{i-1}p_ip_{i+1}$ satisfies $\angle p_{i-1}p_ip_{i+1}<180°$, it is determined that said polygonal pattern is not a convex polygon.

Further, the present invention relates to a method of forming a mask used for the charged particle beam exposure as set forth above, which further comprises a step of:

pattern reversing in which, for every polygonal pattern which is not identified as a convex polygon in said step of discerning, there is set a pattern area for reversing, a boundary of which is composed of four sides of the smallest rectangle containing the whole of the pattern and each side lying parallel to an orthogonal coordinate axis, and by reversing the pattern in this pattern area for reversing, a complementary pattern is formed; wherein in said step of pattern splitting, in every said pattern area for reversing, a cutting line is laid down from every vertex of said complementary pattern to run parallel to a coordinate axis, and thereby pattern splitting is carried out.

Further, the present invention relates to a method of forming a mask used for the charged particle beam exposure as set for the above, wherein, in said step of pattern splitting, in every said pattern area for reversing, from every vertex of said complementary pattern, a cutting line to run parallel to an X-axis and a cutting line to run parallel to a Y-axis are laid down, and when, out of two sets, a set of cutting lines parallel to the X-axis and a set of cutting lines parallel to the Y-axis, one set is to be selected, a set having a larger minimum cutting distance is chosen, and if their minimum cutting distances are the same, a set provided with a smaller number of cutting lines is chosen.

Further, the present invention relates to a method of brining a mask used for the charged particle beam exposure as set forth above, wherein, for every polygonal pattern which is not identified as a convex polygon in said step of discerning, setting a pattern area, a boundary of which is composed of four sides of the smallest rectangle containing the whole of the pattern and each side lying parallel to an orthogonal coordinate axis, and with the exception of any polygonal pattern having the outline which, in shape, is a polygon containing another polygon inside, with the inside polygon free from internally touching the perimeter of the outside polygon, the polygonal pattern in said pattern area for reversing is not subjected to said pattern splitting, when the length of every side of the pattern area for reversing is less than a prescribed standard value.

Further, the present invention relates to a method of forming a mask used for the charged particle beam exposure as set forth above, which further comprises a step of:

pattern reversing in which, for every polygonal pattern which is not identified as a convex polygon in said step of discerning, there is set a pattern area for reversing, a boundary of which is composed of four sides of the smallest rectangle containing the whole of the pattern and each side lying parallel to an orthogonal coordinate axis, and by reversing the pattern in this pattern area for reversing, a complementary pattern is formed; wherein in said pattern area for reversing having a complementary pattern which has, at least, one side in common with the boundary of the pattern area for reversing and, at least, two sides independent of the pattern area boundary, if, for the mask that is to be fabricate, a force applied onto a line segment joining two vertices on the boundary of said pattern area for reversing (excepting vertices of the pattern area) out of vertices of said complementary pattern, is less than a prescribed standard value, said pattern splitting is not to be applied thereto.

Further, the present invention relates to a method of forming a mask used for the charged particle beam exposure as set forth above, wherein, in said step of distributing, one pattern section cut out by said pattern splitting is distributed to a mask different from a mask to which another pattern section, having shared a side on a cutting line therewith, is distributed.

Further, the present invention relates to a method of forming a mask used for the charged particle beam exposure as set forth above, wherein, in said step of distribution, a polygonal pattern that is undivided without having received the pattern splitting is distributed to one of the complementary masks so as to equalize, at the end, an area density of pattern figures assigned thereto with the one assigned to every other complementary masks.

Further, the present invention relates to a method of forming a mask used for the charged particle beam exposure as set for the above, which further comprises a step of rectangular pattern correction, for a rectangular pattern which is, being one of polygonal patterns, identified as a convex polygon in said step of discerning, and has a rectangular pattern figure, and besides an area of the pattern figure exceeds a prescribed reference area; wherein pattern correction is carried out in such a way that with four corners being cut off within a permissible range of accuracy of dimension for the opening pattern, the original rectangular pattern is made to take the form of an octagon.

Further, the present invention relates to a method of forming a mask used for the charged particle beam exposure as set for the above, which further comprises a step of rectangular pattern splitting for a rectangular pattern which is, being one of polygonal patterns, identified as a convex polygon in said step of discerning, and has a rectangular pattern figure, and besides an area of the pattern figure exceeds a prescribed reference area; wherein the original rectangular pattern is split into an octagon from which four corners have been cut off and four triangles corresponding to four corners which have been cut off; and said octagonal pattern and four triangle patterns are distributed onto different masks.

Further, the present invention relates to a program for processing pattern data to form a mask with an opening pattern used for charged particle beam exposure, which makes a computer carry out every step in the method as set forth above.

Further, a "rectangle" as used in the present invention includes a "square" as one of its possible form.

In the present invention, any of the singular patterns which may cause a problem in stencil mask formation is, through systematical identification, extracted and then, each of these singular patterns is split and distributed onto different masks constituting a set of complementary masks so that, while maintaining sufficient mechanical strength, the number of openings can be reduced to a minimum by avoiding superfluous pattern splitting. As a result, a stencil mask capable to improve the reliability of the pattern projection can be provided efficiently.

DETAILED DESCRIPTION OF THE EMBODIMENTS

Now, preferred embodiments of the present invention are described below. A method of the present invention is well suited for the formation of a mask used for the pattern projection of the LSI (Large Scale Integration) patterns which are composed of a group of patterns arrayed parallel to an X-axis or a Y-axis in the orthogonal coordinate system located on the plane of a substrate.

Contouring and Input Data

Prescribed pattern data obtained by the CAD (Computer Aided Design) is supplied for an contouring of the pattern figures represented therewith and pattern data expressed in terms of polygons is made. This polygonal data is used as input data for processing subsequently performed. A "polygon" as used herein is a so-called simple polygon in which only two adjacent sides do intersect or touch with each other. Consequently, polygonal data handled in the present invention represent a plurality of isolated polygons (the outline figure of a pattern is a polygon).

Figure 1:
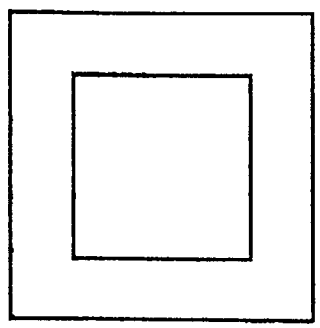
FIG. 1 is a group of views each showing a shape of an opening pattern which may cause a problem in its formation in a stencil mask.
Figure 1:
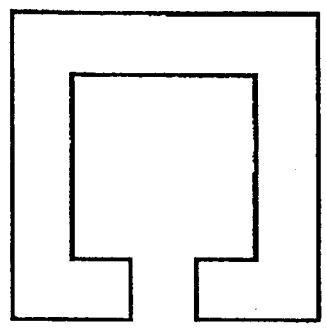
Figure 1:
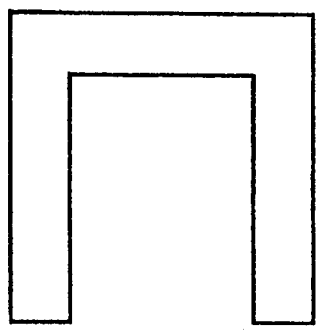
Figure 1:
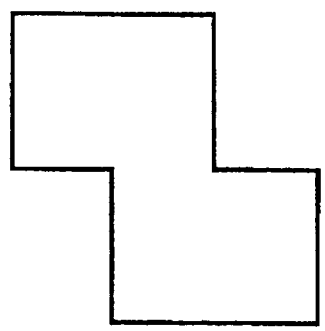
Figure 2:
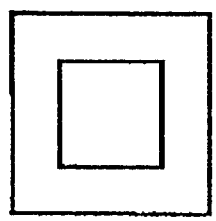
FIG. 2 is a group of views showing an example of conventional pattern splitting.
Figure 2:
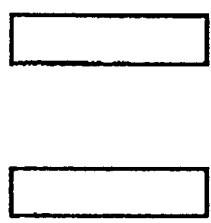
Figure 2:
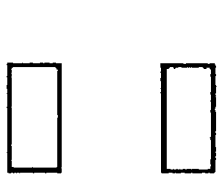
Figure 3:
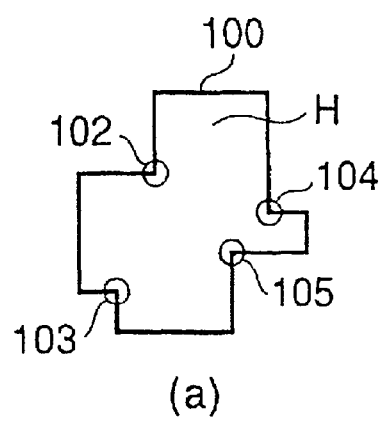
FIG. 3 is a group of views in explaining a conventional method of pattern splitting.
Figure 3:
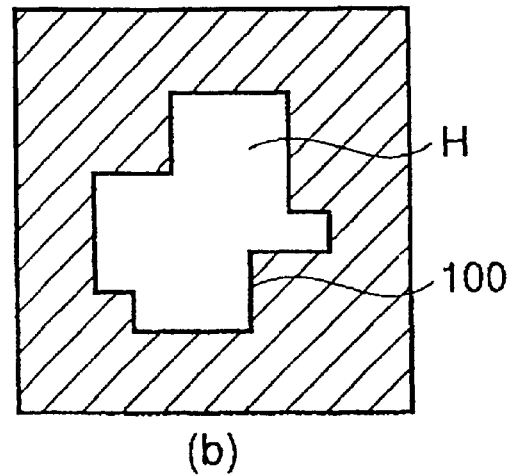
Figure 3:
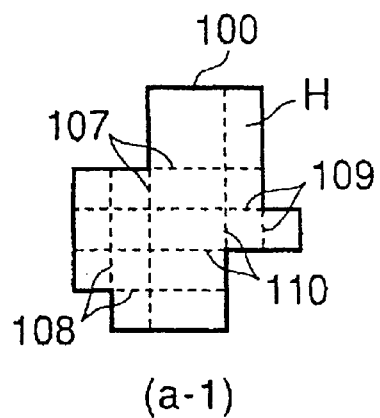
Figure 3:
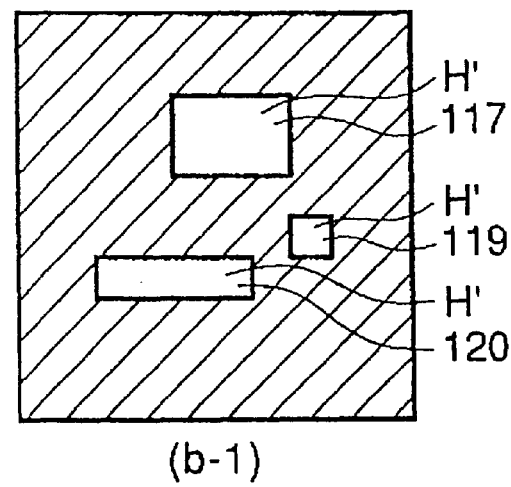
Figure 3:
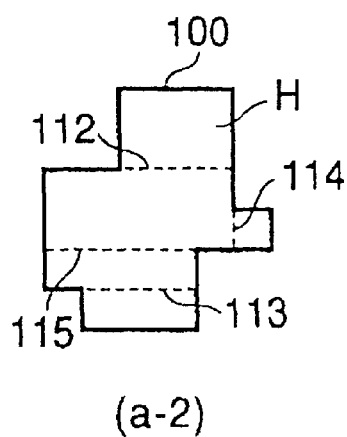
Figure 3:
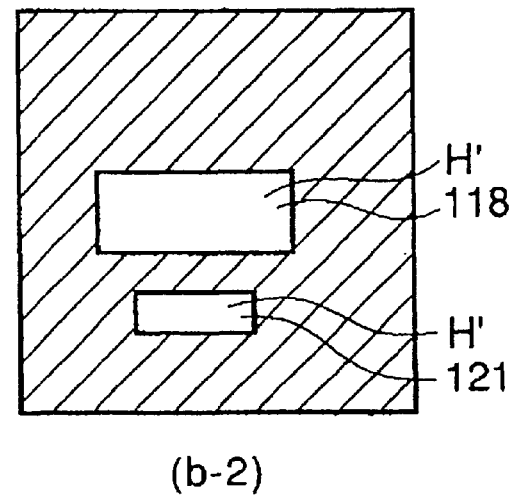
Figure 4:
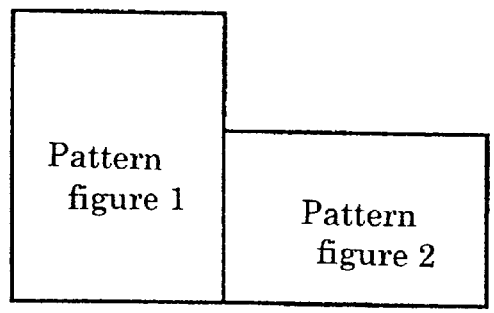
FIG. 4 is a pair of views in explaining the contouring of the pattern figure.
Figure 4:
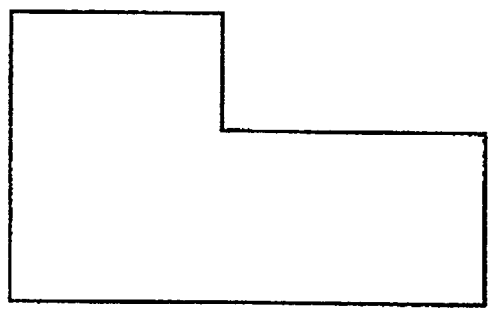

FIG. 4 shows one example of an contouring. Among pattern figures represented with pattern data of the CAD, pattern figures composed of a plurality of small pattern figures or cells (FIG. 4(a)) are subjected to a rimming (an contouring) of the perimeter thereof, and the figures in the shape of obtained outlines (FIG. 4(b)) are taken to be pattern figures (polygons) for the afore-mentioned input data.

Figure 5:
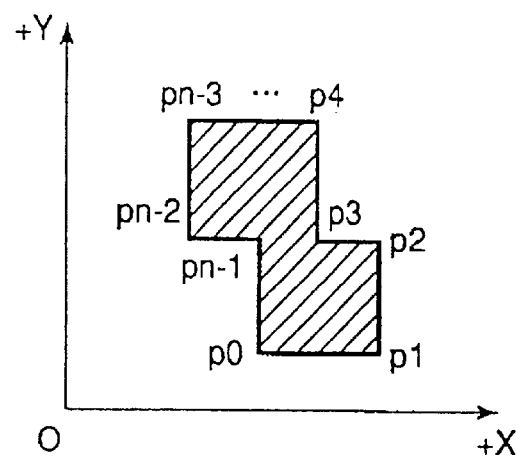
FIG. 5 is a view in explaining a method of representing a polygonal pattern.

Every polygonal pattern in the afore-mentioned input data is to be represented by its outline figure in standard form (the signed area for the polygon must become "positive"). In short, every polygonal pattern is spread out in the first quadrant in the X-Y coordinate system, for example, as shown in FIG. 5. A vertex which has the minimum Y coordinate among vertices (or a vertex with the minimum X coordinate, if more than two vertices have the same Y coordinate) is taken to be the first vertex (p0) and the other vertices, placed in counter-clockwise order therefrom. Herein, if the polygon in FIG. 5 is an n-polygon, pi indicates coordinates (xi, yi) of the vertex i and i (0 to n−1), the number of place for the vertex in arranged order (i for the first vertex is 0).

Figure 6:
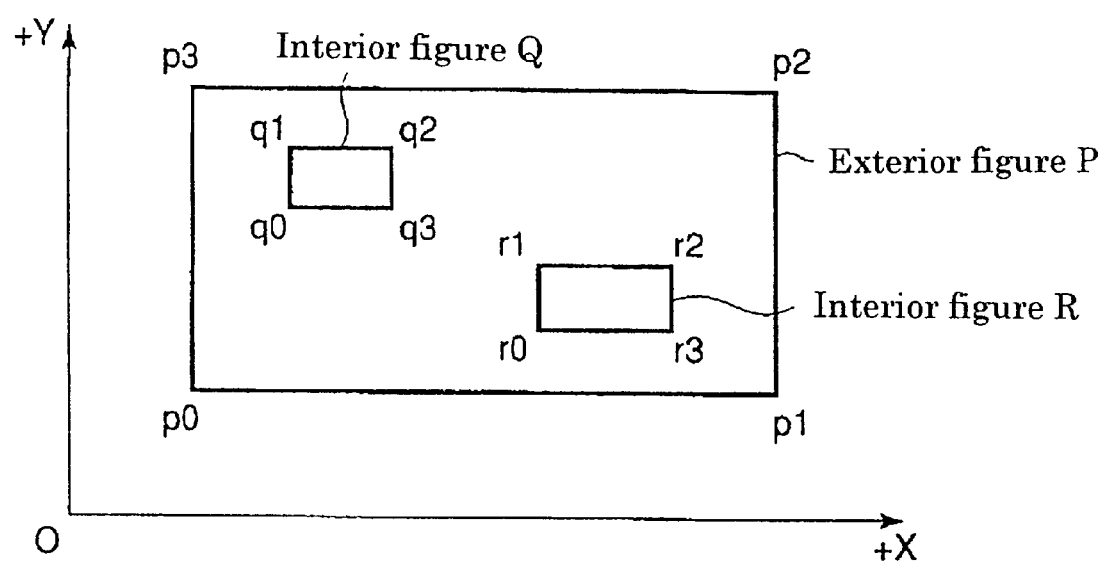
FIG. 6 is a view in explaining a method of representing a polygonal pattern.

In the case of a polygonal pattern such as a doughnut pattern with an internal so-called "physical hole" (referred to as a "doughnut type pattern" hereinafter) having the outline which, in shape, is a polygon (an exterior figure) containing another polygon (an interior figure) inside, with the inside polygon (the interior figure) free from, internally, touching the perimeter of the outside polygon (the exterior figure), because it is required to differentiate the exterior perimeter and the interior perimeter, while the exterior figure is treated as a normal polygon described above and its vertices are described in counter-clockwise order, the vertices of the interior figure are described in clockwise order. One example of that is shown in FIG. 6. While the vertices of the exterior figure P are described in counter-clockwise order, the vertices of the interior figures Q and R are described in clockwise order.

In the step described above, prescribed pattern data obtained by the CAD can be processed at a time, that is, the whole region of the pattern represented therewith together. Nevertheless, it is possible to segment the whole region of the pattern into a plurality of divisions and form a set of input data for each segment division. As a division that is the unit for this segmentation, there may be taken, for instance, in the EPL, a region equivalent to the area (for instance, 1 mm square) on a mask irradiated by one shot of the electron beam.

Identification of Convex Polygonal Pattern

As shown in FIG. 1(a) to (d) described above, patterns (referred to as "singular patterns" hereinafter) which may be detrimental to the stencil mask are characterized by their shape of "not being convex polygons". The convex polygon is a plane figure (a multilateral) bounded by three or more line segments and the interior angles at all its vertices are less than 180 degrees. Further, in a convex polygon, a line segment joining its arbitrary two vertices characteristically always lies within the polygon.

Accordingly, in the present invention, any polygon represented by the afore-mentioned input data is first discerned whether it is a convex polygon or not, and only when the polygon is not a convex polygon, in other words, the pattern is an singular pattern, it is put forward as a candidate requiring pattern splitting.

To discern whether the polygon is a convex polygon or not, for example, a well-known geometrical property, "In a convex polygon, the interior angles at all vertices are less than 180 degrees." can be utilized. In effect, even if only one of the interior angles of the polygon is not less than 180 degrees, it can be concluded that the polygon is not a convex polygon.

Whether the interior angle $\angle p_{i-1}p_ip_{i+1}$ at the vertex $p_i$ (with the exception that, when i=0, the interior angle is set to be $\angle p_{n-1}p_0p_1$ and when i=n-1, the interior angle, $\angle p_{n-2}p_{n-1}p_0$) is less than 180 degrees or not can be, in practice, found out, by obtaining the area with a sign for a triangle $\Delta p_{i-1}p_ip_{i+1}$ made of three adjacent vertices $p_{i-1}$, $p_i$ and $p_{i+1}$. The identification can be herein made according to the following criterion, that is;

when $\Delta p_{i-1}p_ip_{i+0}>0$, $\angle p_{i-1}p_ip_{i+0}<180°$, and when $\Delta p_{i-1}p_ip_{i+0}<0$, $\angle p_{i-1}p_ip_{i+0}>180°$.

Note that, for the inside polygon where vertices are placed in clockwise order, the sign of the triangle area is set reversed.

In the above method, even when the polygon has a large number of vertices, once a set of three adjacent vertices of the polygon gives a sign opposite to the sign in the above criteria to the signed area for the triangle made of these vertices, it can be determined that the polygon is "not a convex polygon". Therefore, it is often advantageously possible to reach the identification without assessing all vertices and as its processing time causes no problem, this method can be readily carried out.

Setting of Pattern Area for Reversing and Pattern Reversing (Setting of Complementary Pattern)

As described above, the stencil mask has a structure in which an opening pattern is formed in a thin substrate. In an electron beam lithography such as a cell projection method and a variable-shaped beam exposure method, as the mask substrate, for instance, a silicon substrate is utilized, and the thickness of the substrate in the region where the opening section is set is generally 10 μm to 20 μm or so when the accelerating voltage is 50 kV, but, in some cases, as thin as 0.2 μm to several μm or so with the object of suppressing heat generation of the mask which may be caused by the electron-beam absorption. In an EPL, the thickness of the substrate in the region where the opening section is set is generally 0.5 μm to 5 μm or so, for example 2 μm when the accelerating voltage is 100 kV.

Examining whether a pattern is detrimental to such a stencil mask or not is equivalent to examining what form the thin substrate region surrounding the opening pattern takes. The form of this thin substrate region surrounding the opening pattern can be obtained by reversing the pattern that is to be transcribed, prior to forming the opening pattern actually in the mask substrate.

In effect, the following processing is applied to every singular pattern (a pattern that is not a convex polygon) identified in the foregoing step.

First, there is set a pattern area for reversing, a boundary of which is composed of four sides of the smallest rectangle containing the whole original pattern figure (a polygon) and each side lying parallel to an orthogonal coordinate axis. This pattern area for reversing may be formed as a region bounded by four sides which run through, among vertices of the original pattern figure, a vertex with the minimum value of X coordinates, a vertex with the maximum value of X coordinates, a vertex with the minimum value of Y coordinates, a vertex with the maximum value of Y coordinates, respectively. In short, the pattern area for reversing may be formed from four vertices coordinates of which are respectively obtained from the combinations of the minimum value and the maximum value of X coordinates and the minimum value and the maximum value of Y coordinates among coordinates of vertices of the original pattern figure.

Figure 7:
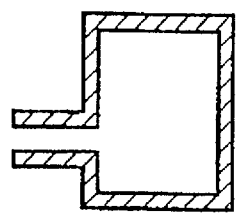
FIG. 7 is a group of views in explaining the pattern area for reversing and pattern reversing (setting of a complementary pattern).
Figure 7:
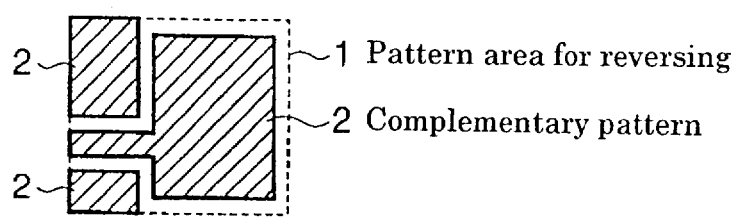
Figure 7:
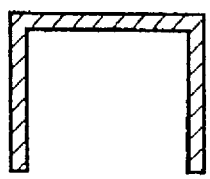
Figure 7:
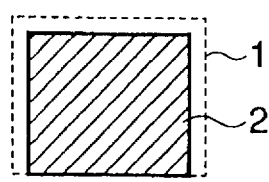
Figure 7:
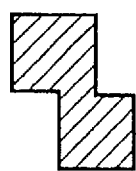
Figure 7:
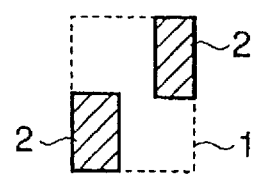
Figure 7:
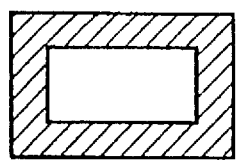
Figure 7:
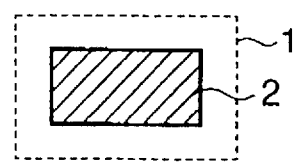

Now, in this pattern area for reversing, a part other than the original pattern figure is set as a "complementary pattern". In other words, the complementary pattern is obtained by reversing the original pattern. FIG. 7 shows examples of setting pattern areas for reversing 1 and complementary patterns 2 (FIGS. 7 (a2), (b2), (c2) and (d2)) for some of typical singular patterns (FIGS. 7 (a1), (b1), (c1) and (d1)).

A processing of pattern reversing may be carried out, by a known method, in the pattern area for reversing described above, using the number of corners of the original pattern figure and the coordinates of respective vertices thereof.

Figure 8:
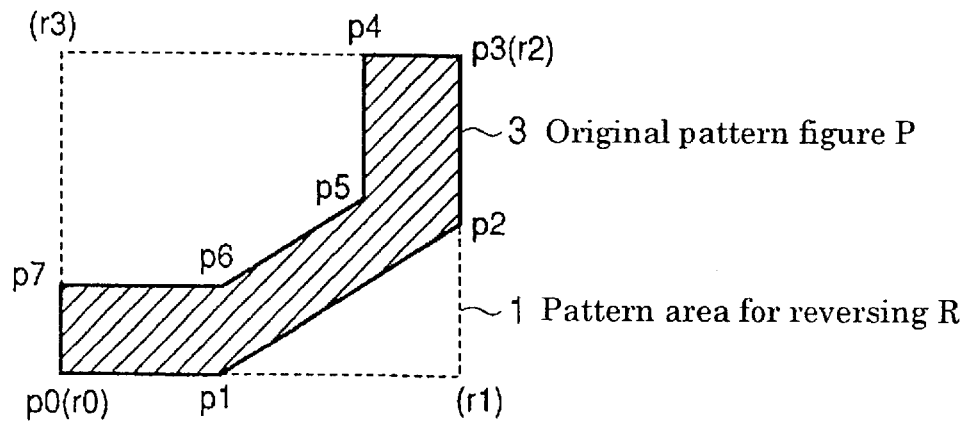
FIG. 8 is a pair of views in explaining the pattern area for reversing and pattern reversing (setting of a complementary pattern).
Figure 8:
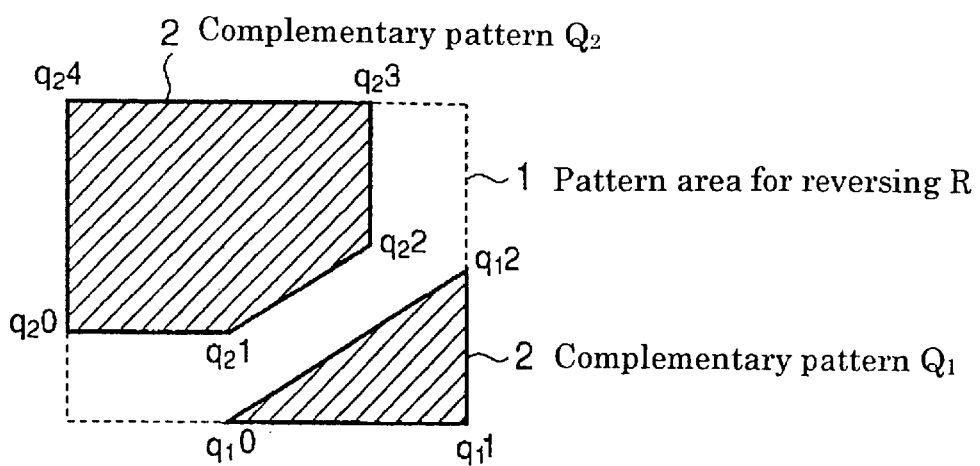

The complementary pattern obtained as described above is composed of vertices of the original pattern figure and vertices of the pattern area for reversing. As the coordinates of every vertex in the pattern area for reversing are obtained from the coordinates of vertices in the original pattern figure, the coordinates of all vertices of the complementary pattern can be obtained only from the coordinates of vertices of the original pattern. Showing an example in FIG. 8, this is explained below. FIG. 8(a) shows an original pattern figure P and a pattern area for reversing R. In the drawing, the original pattern figure P composed of vertices p0, p1, p2, p3, p4, p5, p6 and p7, is represented in the standard form, and its pattern area R composed vertices r0, r1, r2 and r3, is indicated by a dotted line. A processing of pattern reversing is applied to this original pattern figure P in the pattern area R and, with a subsequent rearrangement to the standard form, complementary patterns $Q_1$ (vertices $q_10$, $q_11$ and $q_12$) and $Q_2$ (vertices $q_20$, $q_21$, $q_22$, $q_23$ and $q_24$) shown in FIG. 8(b) are obtained. When these complementary patterns $Q_1$ and $Q_2$ are each expressed in terms of vertices of the original pattern figure P and vertices of its pattern area R, $$Q_1=\{p1, r1, p2\}$$

and $$Q_2=\{p7, p6, p5, p4, r3\}.$$

Since vertices of the pattern area R, herein, are obtained from coordinates of vertices in the original pattern figure, all vertices of complementary patterns $Q_1$ and $Q_2$ are composed of only the coordinates of vertices in the original pattern figure P.

Assessment of Necessity of Pattern Splitting

With respect to patterns (singular patterns), which are not identified as convex polygons in the foregoing step of convex polygon identification, as one of preferred embodiments of the present invention, pattern splitting may be applied to all singular patterns, with the object of achieving equalization of pattern densities in the subsequent step of pattern distribution. However, there are occasions it is preferable to conduct one or both of the following two assessing steps for the patterns which are not identified as convex polygons, and then not to apply the pattern splitting to the patterns which are assessed not requiring the pattern splitting, viewed from the point of reducing the processing (computing) time and lowering errors in finding the overlay positions for shots. By carrying out these assessing steps, an increase in the number of pattern openings by the pattern splitting can be minimized. However, it should be noted that, without these assessments, the doughnut type pattern is invariably subjected to the pattern splitting.

The first assessing method utilizes dimensions of the afore-mentioned pattern area for reversing. In practice, when the length of every side of the pattern area is less than a given standard value, a pattern splitting is not to be applied to a pattern within the pattern area (excepting the doughnut type pattern). In other words, the pattern splitting is to be conducted for patterns with the pattern areas having sides equal to or longer than a given standard dimension and doughnut type patterns.

This first assessing method is based on a fact that the shorter every side of the pattern area for reversing becomes, the smaller the area of the mask substrate region corresponding to the complementary pattern section becomes so that even if an singular pattern is set therein, the mask strength can be secured, up to a certain degree. An actual dimension taken as the assessment standard can be determined, taking the material and thickness of the mask substrate as well as the pattern width (the width of the opening) set in accordance with the design rule into consideration.

The second assessing method makes use of the foregoing complementary pattern. In effect, in a pattern area for reversing having a complementary pattern which has, at least, one side in common with the boundary of the pattern area for reversing and, at least, two sides independent of two pattern area boundary, if, for the mask that is to be fabricated, a force applied onto the line segment (the supporting edge k) joining two vertices on the boundary of the afore-mentioned pattern area for reversing (excepting vertices of the pattern area), out of vertices of the fore-going complementary pattern, is less than a prescribed standard value, the afore-mentioned pattern splitting is not to be conducted.

Figure 9:
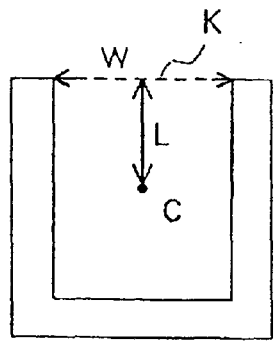
FIG. 9 is a group of views in explaining a method of assessing the necessity of the pattern splitting through the use of a complementary pattern.
Figure 9:
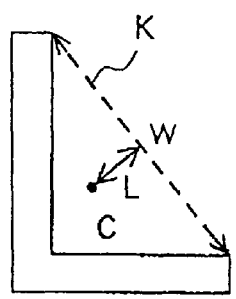
Figure 9:
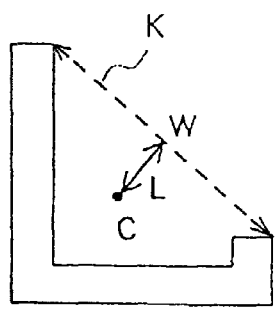
Figure 9:
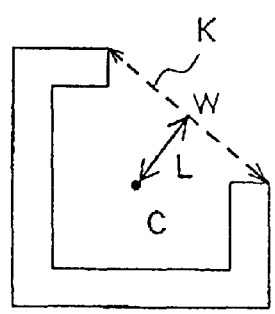
Figure 9:
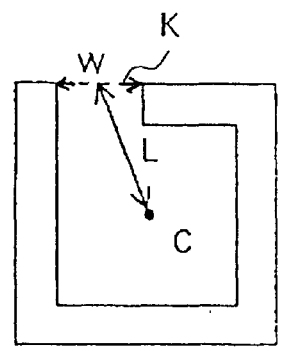

FIG. 9 shows examples of typical patterns that may be assessed by the second assessing method. The pattern in FIG. 9(a) is an example of a pattern whose complementary pattern has one side in common with the boundary of the pattern area for reversing and three sides independent of the pattern area boundary. The pattern in FIG. 9(b) is an example of a pattern whose complementary pattern has two sides in common with the boundary of the pattern area for reversing and two sides independent of the pattern area boundary. The patterns in FIGS. 9(c) and (d) are examples of a pattern whose complementary pattern has two sides in common with the boundary of the pattern area for reversing in either case, but has four sides and six sides independent of the pattern area boundary, respectively. The pattern in FIG. 9(e) is an example of a pattern whose complementary pattern has one side in common with the boundary of the pattern area for reversing and five sides independent of the pattern area boundary. To summarize, for the type of patterns illustrated in FIGS. 9(a) and (e), their complementary patterns each have one side in common with the boundary of the pattern area for reversing and, at least, three sides independent of the pattern area boundary. Against this, for the type of patterns illustrated in FIGS. 9(b) to (d), their complementary patterns each have two sides in common with the boundary of the pattern area for reversing and, at least, two sides independent of the pattern area boundary.

In a stencil mask wherein an opening pattern in the form of this sort is formed, a weight of the mask substrate for a region E bounded by the sides independent of the boundary of the pattern area for reversing and the supporting edge k produces a stress along the supporting edge k. As the force applied to the supporting edge k becomes greater, the mask becomes more liable to be damaged, the damage starting from the vicinity of the supporting edge k, or the line of rupture being produced in the vicinity thereof. In particular, when a Si single crystal substrate is employed as the mask material, damage such as cleavage tends to develop, making two vertices as base points.

The second assessing method can be carried out, for example, as follows. When the area of the afore-mentioned region E and the distance from the center of gravity c of this region E to the middle point of the supporting edge k, and the length of the supporting edge k are denoted by S, L and W, respectively, and the moment of force I is defined as a force applied to the supporting edge k, this moment of force I can be described by the equation $I \propto SL/W$. Therefore, it is possible to set a reference value for this SL and make it a rule that a pattern having an SL value smaller than that reference value is not subjected to the pattern splitting. This reference value depends on the mechanical strength of the constituting material of the mask that is to be fabricated and can be determined empirically, using data obtained by experiments.

By performing such an assessing step, superfluous pattern splitting can be avoided and, thus, with the processing time reduced, the mask can be formed efficiently. In addition, because the number of openings can be minimized, a stencil mask, possible to improve the reliability of the pattern projection, can be fabricated.

On the other hand, if it is preferable to equalize the pattern densities with a high accuracy in the step of distribution described below, the number of splittings may be set considerably large as long as the reliability of the pattern projection remains acceptable.

Pattern Splitting

For the patterns that are assessed as singular patterns by the foregoing methods, it is preferable to employ the pattern splitting method utilizing the foregoing complementary pattern, which is described below. Through the use of the following pattern splitting method, a pattern can be split into pattern sections with appropriate sizes by the minimum number of splittings, and, at the same time, these sections can be efficiently distributed onto a plurality of masks so as not to come into contact with one another within one and the same mask. Further, in the case that the pattern area for reversing and the complementary pattern have been already set in the afore-mentioned step of assessing the necessity of the pattern splitting, their data can be utilized, so that the pattern splitting can be processed very rapidly.

Figure 10:
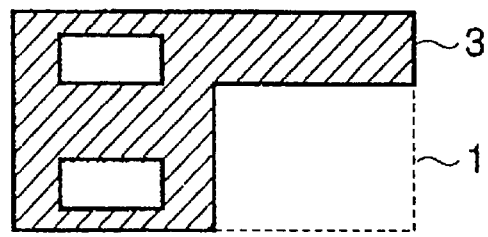
FIG. 10 is a group of views in explaining a method of pattern splitting and a method of distribution.
Figure 10:
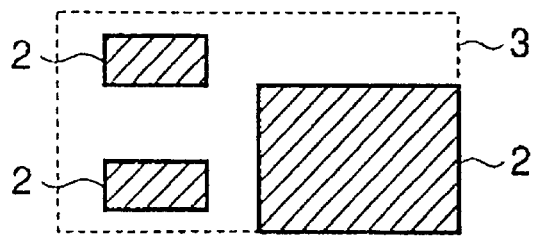
Figure 10:
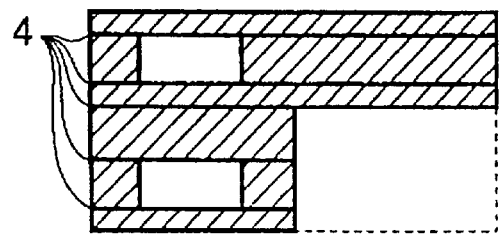
Figure 10:
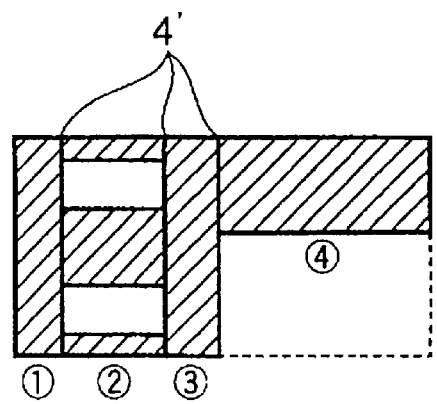

Taking, as an example, the case in which a doughnut type pattern shown in FIG. 10(a) is set to be an original pattern figure, pattern splitting is described below. First, as shown in FIG. 10(a), a pattern area for reversing 1 is set for the original pattern 3, and then, as shown in FIG. 10(b), a complementary pattern 2 is set. If the pattern area for reversing and the complementary pattern have been already set in the afore-mentioned step of assessing the necessity of the pattern splitting, they can be utilized here.

Next, from vertices of the complementary pattern, candidates of the cutting points are chosen. The vertices of the complementary pattern which can be candidates must be within the pattern area for reversing (exclusive of the pattern area boundary). From every vertex put forward as a candidate, a cutting line is laid down to run along a coordinate axis. FIG. 10(c) shows cutting lines 4 which are laid down from vertices of the complementary pattern to run parallel to the direction of the X-axis. FIG. 10(d) shows cutting lines 4' which are laid down from vertices of the complementary pattern to run parallel to the direction of the Y-axis.

Next, one of two sets, which are a set of cutting lines parallel to the X-axis and a set of cutting lines parallel to the Y-axis, is selected. The criterion for this selection is set, for instance, such that a set having a larger minimum cutting distance is chosen and, if that is the same, a set provided with a smaller number of cutting lines is chosen. The minimum cutting distance as used herein indicates the shortest distance between two adjacent cutting lines among a set of cutting lines running parallel to a coordinate axis. In the present embodiment, following this criterion, a set of cutting lines 4' is selected. That is, for the pattern shown in FIG. 10(a), a set of cutting lines 4' shown in FIG. 10(d) is selected.

Figure 11:
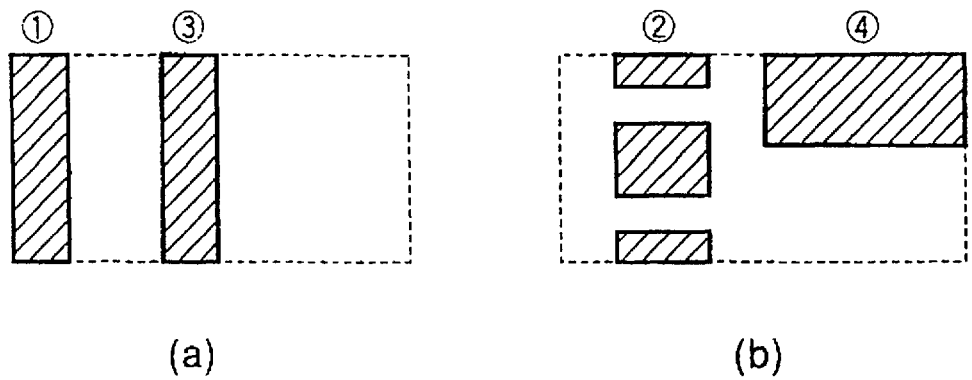
FIG. 11 is a pair of views in explaining a method of pattern splitting and a method of distribution.

Next, a list of intersections of selected cutting lines 4' and sides of the original pattern figure is made up, and this list of intersections is sorted in ascending order (In this example, cuttings are made along the direction of Y-axis so that the list is sorted in ascending order of Y coordinates). In FIG. 10(d), splitting is processed from the left. The data for split pattern sections are distributed onto different files so as not to send the output to the file of the data for the pattern section that is adjacent before splitting (FIG. 11). Here, respective files correspond to a mask constituting a set of complementary masks. Further, numerals each enclosed with a circle indicate the order of partition.

Pattern Distributing

The data for respective pattern sections obtained by the pattern splitting processing are distributed onto files, each of which corresponds to a mask constituting a set of complementary masks. Because the pattern is formed by the layout of the opening in the stencil mask, pattern sections must therefore be distributed so as not to come into contact with one another within a mask. For this reason, as the aforementioned FIG. 10(d) and FIG. 11 show, one pattern section cut out by the pattern splitting is distributed to a mask different from the one to which another pattern section having shared a side on a cutting line therewith is distributed. In other words, every pattern section is distributed in such a way that two adjacent pattern sections before the splitting are never assigned to the one and same mask.

Subsequently, data for every other pattern figure that is undivided without having received the pattern splitting is distributed to one of the files to which pattern sections have been already assigned. Thereat, the distribution of a pattern figure is first made to the file with the lowest area density of the pattern figure (pattern density) that have been already assigned and proceeds in like manner so that the area densities of the pattern figure assigned in all masks may become approximately equal at the end. Such distribution as to equalize pattern densities may also equalize the stress caused by the opening pattern in the mask, thus reducing the difference in distortion of the opening pattern among masks in a set of complementary masks, and besides can moderate the difference in the Coulomb effect on the image-forming charged particles so that the pattern projection can be achieved with a high accuracy.

Correction and Partition of Large Rectangular Opening Pattern

Figure 12:
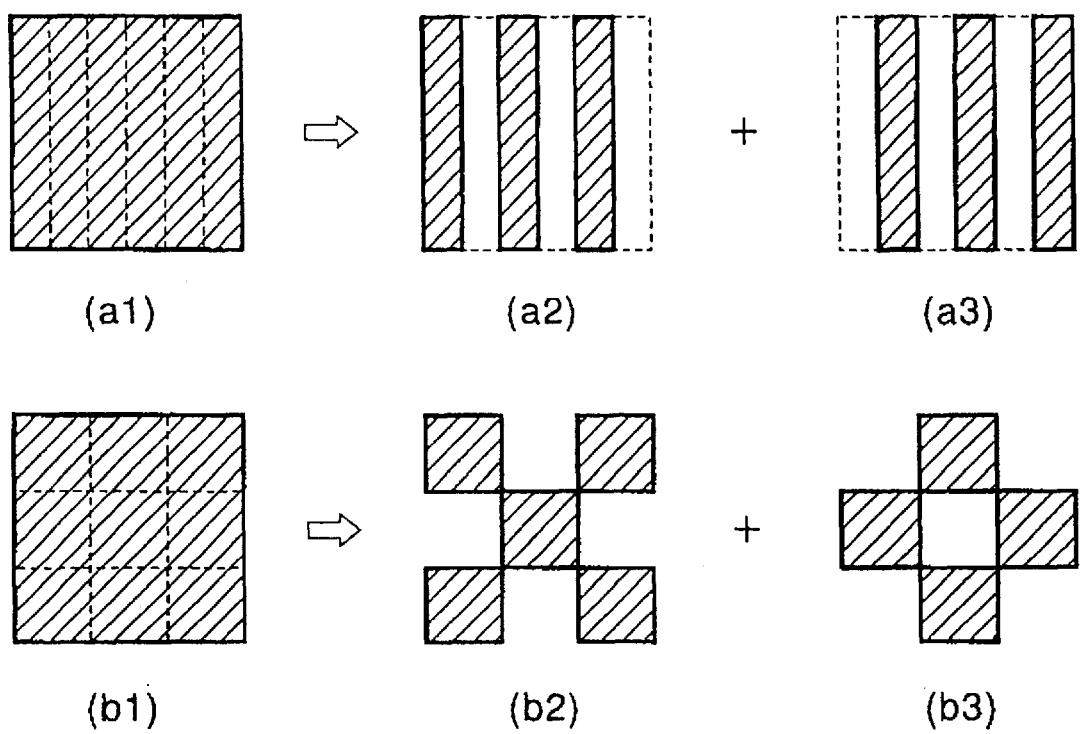
FIG. 12 is two sets of view, each in explaining a conventional method of splitting a large rectangular opening pattern.

Even in the case of a rectangular pattern that is a convex pattern, if its size is substantially large, cracks are liable to develop, as the stress is centered at its corners. In a stencil mask fabricated with a silicon substrate, especially when the length of a side of the rectangular opening exceeds 10 $\mu$m, a problem of this sort tends to arise. For such a large rectangular opening pattern, it has been proposed to partition the pattern into strip-shaped sections and provide a set of complementary masks with line and space patterns (FIGS. 12 (a1) and (a3)). However, the line-shaped opening pattern is, if large in size, easily deformed and its accurate projection is hard to achieve. On the other hand, if a large, rectangular opening pattern is split like a grid to form a set of complementary masks with patterns in the form of a checker flag, they are unmanufacturable, because point contacts are created at corners of the grid therein, and this leads to damage at the point contact sections and even drop-out of inside shapes (FIGS. 12(b1)–(b3)).

Therefore, in the present invention, the area of a rectangular pattern is first obtained and if it exceeds a predetermined reference value (area), the pattern is preferably subjected to either pattern correction or pattern splitting described below. For a stencil mask fabricated with a silicon substrate, this reference value can be set to be, for example, 100 $\mu$m$^2$ or higher. By performing such an assessing step, superfluous pattern partitions and pattern corrections can be avoided and, thus, masks can be formed efficiently. Furthermore, without performing superfluous pattern partitions, the number of openings can be minimized and a stencil mask capable to improve the reliability of the pattern projection can be fabricated.

Figure 13:
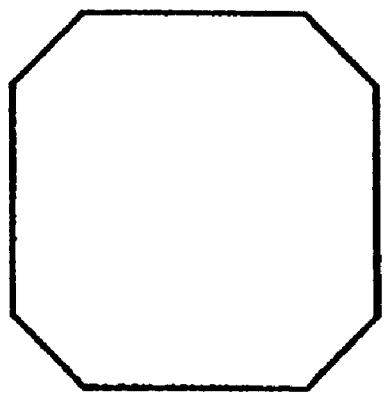
FIG. 13 is a group of views in explaining a correcting method and a splitting method for a large rectangular opening pattern, according to the present invention.
Figure 13:
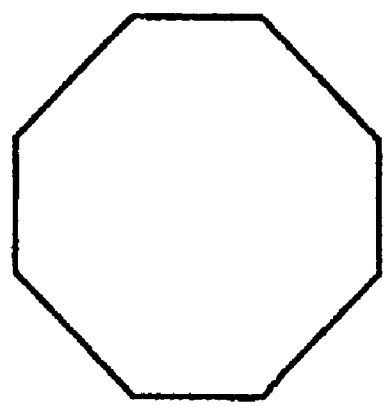
Figure 13:
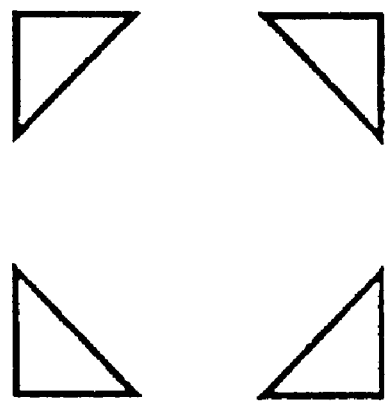

The correction of a rectangular pattern is made by cutting off four corners and shaping it into an octagonal form, as shown in FIG. 13(a). Thereby, an octagonal pattern after the correction must take a form within a permissible range of the original rectangular pattern. That is, when permissible accuracy of dimension is 5% or so, any cutting point on a side may be, for example, equal to or less than 5% of that side's length away from a vertex.

Meanwhile, the splitting of a rectangular pattern is made by cutting off four corners and splitting the pattern into an octagon from which four corners have been cut off and four triangles corresponding to four corners which have been cut off, as shown in FIGS. 13(b) and (c). Thereby, any cutting point on a side may be, for example, less than 50% and preferably less than 45% of that side's length away from a vertex. Further, if a cutting point is less than 5% of the side's length away from a vertex, the foregoing pattern correction can cope with the case readily, and thus any cutting point for the splitting is preferably equal to or greater than 5% thereof away from a vertex. By setting each cutting point equal to or greater than 5% thereof from a vertex, triangular pattern sections, each corresponding to a corner, may have an appropriate size. Because of this, the mask can be made more easily and exact overlay positions for pattern sections at the time of pattern projection also become easier to find. Meanwhile, for setting each cutting point equal to or less than 45% thereof away from a vertex, the corner sections of an octagon from which four corners have been cut off may take an appropriate shape. This enables the corresponding corner sections of the opening pattern in the mask to secure sufficient mechanical strength.

The method described so far comprises the steps of various processing, starting from the contouring and the data input, up to the pattern distribution, and can be carried out rapidly and efficiently by a computer, following a program which is provided to command a computer to carry out these processing.

What is claimed is:

1. A method of forming a mask with an opening pattern used for a charged particle beam exposure; which comprises the steps of:
    contouring a pattern figure represented by prescribed pattern data;
    discerning whether every polygonal pattern represented by said pattern data being obtained through said contouring is a convex polygon or not, a polygon being convex if the interior angles at all vertices are less than 180 degrees;
    splitting every said polygonal pattern which is not identified as said convex polygon into a plurality of pattern sections; and
    distributing said plurality of pattern sections onto masks which constitute a set of complementary masks, such that adjacent pattern sections are distributed to different masks.

2. A method of forming a mask used for the charged particle beam exposure according to claim 1, wherein, in said step of discerning, a signed area of triangle $\Delta p_{i-1} p_i p_{i+1}$ composed of three adjacent vertices $p_{i-1}$, $p_i$ and $p_{i+1}$ is obtained one by one for a vertex $p_i$ in the polygonal pattern, and once there are identified vertices for which a signed area $\Delta p_{i-1} p_i p_{i+1}$ becomes opposite to the sign thereof with which an interior angle $\angle p_{i-1} p_i p_{i+1}$ satisfies $\angle p_{i-1} p_i p_{i+1} < 180°$, it is determined that said polygonal pattern is not a convex polygon.

3. A method of forming a mask used for the charged particle beam exposure according to claim 1, which further comprises a step of:
    pattern reversing in which, for every polygonal pattern which is not identified as a convex polygon in said step of discerning, there is set a pattern area for reversing, a boundary of which is composed of four sides of the smallest rectangle containing the whole original pattern figure (a polygon) and each side lying parallel to an orthogonal coordinate axis, and by reversing the pattern in this pattern area for reversing, a complementary pattern is formed; wherein
        in said step of pattern splitting, in every said pattern area for reversing, a cutting line is laid down from every vertex of said complementary pattern to run parallel to a coordinate axis, and thereby pattern splitting is carried out.

4. A method of forming a mask used for the charged particle beam exposure according to claim 3, wherein, in said step of pattern splitting, in every said pattern area for reversing, from every vertex of said complementary pattern, a cutting line to run parallel to an X-axis and a cutting line to run parallel to a Y-axis are laid down, and when, out of two sets, a set of cutting lines parallel to the X-axis and a set of cutting lines parallel to the Y-axis, one set is to be selected, a set having a larger minimum cutting distance is chosen, and if their minimum cutting distances are the same, a set provided with a smaller number of cutting lines is chosen.

5. A method of forming a mask used for the charged particle beam exposure according to claim 1, wherein, for every polygonal pattern which is not identified as a convex polygon in said step of discerning, setting a pattern area for reversing, a boundary of which is composed of four sides of the smallest rectangle containing the whole original pattern figure (a polygon) and each side lying parallel to an orthogonal coordinate axis, and
    with the exception of any polygonal pattern having the outline which, in shape, is a polygon containing another polygon inside, with the inside polygon free from internally touching the perimeter of the outside polygon, the polygonal pattern in said pattern area for reversing is not subjected to said pattern splitting, when the length of every side of the pattern area for reversing is less than a prescribed standard value.

6. A method of forming a mask used for the charged particle beam exposure according to claim 1, which further comprises a step of:
    pattern reversing in which, for every polygonal pattern which is not identified as a convex polygon in said step of discerning, there is set a pattern area for reversing, a boundary of which is composed of four sides of the smallest rectangle containing the whole original pattern figure (a polygon) and each side lying parallel to an orthogonal coordinate axis, and by reversing the pattern in this pattern area for reversing, a complementary pattern is formed; wherein
        in said pattern area for reversing having a complementary pattern which has, at least, one side in common with the boundary of the pattern area for reversing and, at least, two sides independent of the pattern area boundary, if, for the mask that is to be fabricated, a force applied onto a line segment joining two vertices on the boundary of said pattern area for reversing (excepting vertices of the pattern area) out of vertices of said complementary pattern, is less than a prescribed standard value, said pattern splitting is not to be applied thereto.

7. A method of forming a mask used for the charged particle beam exposure according to claim 1, wherein, in said step of distributing, a polygonal pattern that is undivided without having received the pattern splitting is distributed to one of the complementary masks so as to equalize, at the end, an area density of pattern figures assigned thereto with the one assigned to every other complementary masks.

8. A method of forming a mask used for the charged particle beam exposure according to claim 1, which further comprises a step of rectangular pattern correction, for a rectangular pattern, being one of said polygonal patterns, identified as a convex polygon in said step of discerning, wherein an area of the pattern figure exceeds a prescribed reference area; wherein pattern correction is carried out in such a way that with four corners being cut off within a permissible range of accuracy of dimension for the opening pattern, the original rectangular pattern is made to take the form of an octagon.

9. A method of forming a mask used for the charged particle beam exposure according to claim 1, which further comprises a step of rectangular pattern splitting for a rectangular pattern, being one of said polygonal patterns, identified as a convex polygon in said step of discerning, wherein an area of the pattern figure exceeds a prescribed reference area; wherein the original rectangular pattern is split into an octagon from which four corners have been cut off and four triangles corresponding to the four corners which have been cut off; and said octagonal pattern and four triangle patterns are distributed onto different masks.

10. A method of forming a mask used for the charged particle beam exposure according to claim 1, wherein said prescribed pattern data is data for LSI patterns arrayed parallel to an X-axis or a Y-axis in the orthogonal coordinate system.

11. A program for processing pattern data to form a mask with an opening pattern used for charged particle beam exposure, comprising:
   first computer code for contouring a pattern figure represented by prescribed pattern data;
   second computer code for discerning whether every polygonal pattern represented by said pattern data being obtained through said contouring is a convex polygon or not, a polygon being convex if the interior angles at all vertices are less than 180 degrees;
   third computer code for splitting every said polygonal pattern which is not identified as said convex polygon into a plurality of pattern sections; and
   fourth computer code for distributing said plurality of said pattern sections onto masks which constitute a set of complementary masks, such that adjacent pattern sections are distributed to different masks.

12. A program as in claim 11, wherein, in said second computer code for discerning, a signed area of triangle $\Delta p_{i-1}p_ip_{i+1}$ composed of three adjacent vertices $p_{i-1}$, $p_i$ and $p_{i+1}$ is obtained one by one for a vertex $p_i$ in the polygonal pattern, and once there are identified vertices for which a signed area $\Delta p_{i-1}p_ip_{i+1}$ becomes opposite to the sign thereof with which an interior angle $\angle p_{i-1}p_ip_{i+1}$ satisfies $\angle p_{-1}p_ip_{i+1} < 180°$, it is determined that said polygonal pattern is not a convex polygon.

13. A program as in claim 11, further comprising fifth computer code for pattern reversing in which, for every polygonal pattern which is not identified as a convex polygon in said step of discerning, there is set a pattern area for reversing, a boundary of which is composed of four sides of the smallest rectangle containing the whole original pattern figure (a polygon) and each side lying parallel to an orthogonal coordinate axis, and by reversing the pattern in this pattern area for reversing, a complementary pattern is formed;
   wherein in said third computer code for pattern splitting, in every said pattern area for reversing, a cutting line is laid down from every vertex of said complementary pattern to run parallel to a coordinate axis, and thereby pattern splitting is carried out.

14. A program as in claim 13, wherein, in said third computer code for pattern splitting, in every said pattern area for reversing, from every vertex of said complementary pattern, a cutting line to run parallel to an X-axis and a cutting line to run parallel to a Y-axis are laid down, and when, out of two sets, a set of cutting lines parallel to the X-axis and a set of cutting lines parallel to the Y-axis, one set is to be selected, a set having a larger minimum cutting distance is chosen, and if their minimum cutting distances are the same, a set provided with a smaller number of cutting lines is chosen.

15. A program as in claim 11, wherein, for every polygonal pattern which is not identified as a convex polygon in said second computer code for discerning, setting a pattern area for reversing, a boundary of which is composed of four sides of the smallest rectangle containing the whole original pattern figure (a polygon) and each side lying parallel to an orthogonal coordinate axis, and
   with the exception of any polygonal pattern having the outline which, in shape, is a polygon containing another polygon inside, with the inside polygon free from internally touching the perimeter of the outside polygon, the polygonal pattern in said pattern area for reversing is not subjected to said pattern splitting, when the length of every side of the pattern area for reversing is less than a prescribed standard value.

16. A program as in claim 11, further comprising sixth computer code for pattern reversing in which, for every polygonal pattern which is not identified as a convex polygon in said step of discerning, there is set a pattern area for reversing, a boundary of which is composed of four sides of the smallest rectangle containing the whole original pattern figure (a polygon) and each side lying parallel to an orthogonal coordinate axis, and by reversing the pattern in this pattern area for reversing, a complementary pattern is formed;
   wherein in said pattern area for reversing having a complementary pattern which has, at least, one side in common with the boundary of the pattern area for reversing and, at least, two sides independent of the pattern area boundary, if, for the mask that is to be fabricated, a force applied onto a line segment joining two vertices on the boundary of said pattern area for reversing (excepting vertices of the pattern area) out of vertices of said complementary pattern, is less than a prescribed standard value, said pattern splitting is not to be applied thereto.

17. A program as in claim 11, wherein, in said fourth computer code for distributing, a polygonal pattern that is undivided without having received the pattern splitting is distributed to one of the complementary masks so as to equalize, at the end, an area density of pattern figures assigned thereto with the one assigned to every other complementary masks.

18. A program as in claim 11, further comprising seventh computer code for rectangular pattern correction, for a rectangular pattern, being one of said polygonal patterns, identified as a convex polygon by said second computer code for discerning, wherein an area of the pattern figure exceeds a prescribed reference area; wherein pattern correction is carried out in such a way that with four corners being cut off within a permissible range of accuracy of dimension for the opening pattern, the original rectangular pattern is made to take the form of an octagon.

19. A program as in claim 11, further comprising eighth computer code for rectangular pattern splitting for a rectangular pattern, being one of said polygonal patterns, identified as a convex polygon in said step of discerning, wherein an area of the pattern figure exceeds a prescribed reference area;
   wherein the original rectangular pattern is split into an octagon from which four corners have been cut off and four triangles corresponding to the four corners which have been cut off; and said octagonal pattern and four triangle patterns are distributed onto different masks.

* * * * *